US012275325B2

(12) United States Patent
Henriksson et al.

(10) Patent No.: US 12,275,325 B2
(45) Date of Patent: Apr. 15, 2025

(54) OFFLINE MANAGEMENT FOR CLOUD-BASED DYNAMIC LOAD MANAGEMENT

(71) Applicant: LIIKENNEVIRTA OY / VIRTA LTD, Helsinki (FI)

(72) Inventors: Jani Henriksson, Espoo (FI); Vo Ngoc, Espoo (FI)

(73) Assignee: Liikennevirta Oy / Virta Ltd, Helsinki (FI)

( * ) Notice: Subject to any disclaimer, the term of this patent is extended or adjusted under 35 U.S.C. 154(b) by 0 days.

(21) Appl. No.: 18/692,069

(22) PCT Filed: Aug. 15, 2023

(86) PCT No.: PCT/FI2023/050468
§ 371 (c)(1),
(2) Date: Mar. 14, 2024

(87) PCT Pub. No.: WO2024/038225
PCT Pub. Date: Feb. 22, 2024

(65) Prior Publication Data
US 2024/0262238 A1    Aug. 8, 2024

(30) Foreign Application Priority Data

Aug. 19, 2022    (FI) ..................................... 20225737

(51) Int. Cl.
*B60L 53/67*  (2019.01)
*B60L 53/63*  (2019.01)
(Continued)

(52) U.S. Cl.
CPC ............... *B60L 53/67* (2019.02); *B60L 53/63* (2019.02); *B60L 53/68* (2019.02); *G01R 19/2513* (2013.01)

(58) Field of Classification Search
CPC ........ G05B 19/401; G05B 2219/36284; G05B 2219/49097; G05B 2219/49382;
(Continued)

(56) References Cited

U.S. PATENT DOCUMENTS 11,264,800 B2    3/2022  North et al.
2006/0053324 A1*  3/2006  Giat ........................ H04L 12/10
                                                  713/300
(Continued)

FOREIGN PATENT DOCUMENTS

CN    111845424 A    10/2020
CN    114506239 A    5/2022
(Continued)

OTHER PUBLICATIONS

Finnish Search Report received for Finnish U.S. Appl. No. 20/225,737, filed Mar. 22, 2023, (2 pages).
(Continued)

*Primary Examiner* — Santosh R Poudel
(74) *Attorney, Agent, or Firm* — Alston & Bird LLP

(57) ABSTRACT

Example embodiments provide improved dynamic load management for an electric vehicle charging system. A cloud-based apparatus is configured to adjust maximum current ratings of charging stations when one or more charging stations drop offline based on a latest accepted request for maximum charging current of the offline charging station. An apparatus, a method, and a computer program are disclosed.

12 Claims, 5 Drawing Sheets

(51) Int. Cl.
  *B60L 53/68* (2019.01)
  *G01R 19/25* (2006.01)
(58) Field of Classification Search
  CPC .. B23Q 15/013; B23Q 15/12; B23Q 17/0961; B23Q 17/0971; B23Q 15/0075; B23Q 17/00; B23Q 41/00; B23B 35/00
  See application file for complete search history.

(56) References Cited

U.S. PATENT DOCUMENTS

| | | | |
|---|---|---|---|
| 2010/0134067 A1* | 6/2010 | Baxter | B60L 3/0084 320/109 |
| 2014/0225565 A1 | 8/2014 | Eger et al. | |
| 2020/0376976 A1* | 12/2020 | Ahtikari | H02J 7/00 |
| 2021/0178925 A1 | 6/2021 | Metzger et al. | |
| 2021/0252991 A1* | 8/2021 | Pizzurro | B60L 53/11 |

FOREIGN PATENT DOCUMENTS

| | | |
|---|---|---|
| DE | 10 2017 124469 B4 | 10/2021 |
| EP | 2 991 854 B1 | 6/2021 |
| JP | 2013141360 A * | 7/2013 |
| WO | WO 2022/157418 A1 | 7/2022 |

OTHER PUBLICATIONS

International Search Report received for International Application No. PCT/FI2023/050468, mailed Sep. 18, 2023, (5 pages).
Written Opinion of the International Searching Authority received for International Application No. PCT/FI2023/050468, mailed on Sep. 18, 2023, (6 pages).

* cited by examiner

OFFLINE MANAGEMENT FOR CLOUD-BASED DYNAMIC LOAD MANAGEMENT

CROSS-REFERENCE TO RELATED APPLICATIONS

The present application is a national phase entry of International Application No. PCT/FI2023/050468, filed Aug. 15, 2023, which claims priority to Finnish Application No. 20225737, filed Aug. 19, 2022, which is incorporated herein by reference in its entirety.

TECHNICAL FIELD

The present application generally relates to management of electric vehicle charging stations. In particular, some example embodiments of the present application relate to robust management for cloud-based demand load management in case of offline periods.

BACKGROUND

Charging stations may be subject to load management services. The load management services are used to adjust a total charging current the charging stations on-site cannot exceed. The limitations may be due to grid connection limitations, peak shaving, peak shifting, demand side management, and the like. It would be beneficial to ensure operation of the load management under different conditions.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

Example embodiments may enable dynamic load management in a fail-safe manner in case one or more charging stations drop offline. The dynamic load management may be implemented such that when a charging station is detected to lose an internet connection to an apparatus responsible for the dynamic load management, maximum current rating of an associated dynamic load management group is changed based on a current setting of the charging station without the internet connection.

According to a first aspect an apparatus for dynamic load management is provided. The apparatus comprises a communication interface for wireless communication with a plurality of charging stations; at least one processor; and at least one memory comprising instructions which, when executed by the at least one processor, cause the apparatus to monitor for events indicative of status changes of the plurality of charging stations via the communication interface; determine based on the events that at least one charging station has changed status from online to offline; determine if the at least one charging station belongs to a dynamic load management group; determine a current maximum current rating of the dynamic load management group; determine a latest request for a maximum charging current of the charging station accepted by the at least one charging station; determine a new maximum current rating for the dynamic load management group by reducing the current maximum current rating of the dynamic load management group by a maximum charging current of the latest accepted request; determine new maximum charging currents for each charging station in the dynamic load management group which remained online; and send a message comprising the new maximum charging current to each of the online charging stations for current adjustment via the communication interface.

According to an embodiment, the at least one memory further comprises instructions which, when executed by the at least one processor, cause the apparatus to determine based on the events that a charging station is inactive; determine if the inactive charging station belongs to a dynamic load management group; set the maximum charging current of the inactive charging station belonging to the dynamic load management group to a predetermined value; and send a message comprising the predetermined value as the maximum charging current to the inactive charging station via the communication interface.

In an embodiment, in addition or alternatively, the predetermined value is 6 A.

In an embodiment, in addition or alternatively, the events comprise at least one of a transaction event, a status notification or a skipped heartbeat.

In an embodiment, in addition or alternatively, the at least one memory further comprises instructions which, when executed by the at least one processor, cause the apparatus to detect, based on the events, that at least one charging station has changed status from offline to online; recalculate the maximum current rating for the respective dynamic load management group by in-creasing the present maximum current rating with a value of the latest accepted request for a maximum charging current of the charging station that is online again; and send a message comprising the new maximum charging current to each of the online charging stations for current adjustment via the communication interface.

In an embodiment, in addition or alternatively, the at least one memory further comprises instructions which, when executed by the at least one processor, cause the apparatus to check if setting the maximum charging current of an inactive charging station to the predetermined value is allowed the respective dynamic load management group; and wherein the maximum charging current t of inactive charging stations is changed to the predetermined value when it is allowed for the respective dynamic load management group.

According to a second aspect, computer-implemented method is provided for dynamic load management. The method may comprise monitoring for events indicative of status changes of a plurality of charging stations via a communication interface configured for wireless communication; determining based on the events that at least one charging station has changed status from online to offline; determining if the at least one charging station belongs to a dynamic load management group; determining a current maximum current rating of the dynamic load management group; determining a latest request for a maximum charging current of the charging station accepted by the at least one charging station; determining a new maximum current rating for the dynamic load management group by reducing the current maximum current rating of the dynamic load management group by a maximum charging current of the latest accepted request; determining new maximum charging currents for each charging station in the dynamic load management group which remained online; and sending a message comprising the new maximum charging current to each of the online charging stations for current adjustment via the communication interface. In an embodiment, the method comprises determining based on the events that a charging station s inactive; determining if the inactive charging station belongs to a dynamic load management group; setting the maximum charging current of the inactive charging station belonging to the dynamic load management group to a predetermined value; and sending a message comprising the predetermined value as the maximum charging current to the inactive charging station via the communication interface.

In an embodiment, in addition or alternatively, the predetermined value is 6 A.

In an embodiment, in addition or alternatively, the events comprise at least one of a transaction event, a status notification or a skipped heartbeat.

In an embodiment, in addition or alternatively, the method further comprises detecting, based on the events, that at least one charging station has changed status from offline to online; recalculating the maximum current rating for the respective dynamic load management group by increasing the present maximum current rating with a value of the latest accepted request for a maximum charging current of the charging station that is online again; and sending a message comprising the new maximum charging current to each of the online charging stations for current adjustment via the communication interface.

In an embodiment, in addition or alternatively, the method comprises checking if setting the maximum charging current of an inactive charging station to the predetermined value is allowed for the respective dynamic load management group; and changing the maximum charging current of inactive charging stations to the predetermined value when it is allowed for the respective dynamic load management group.

According to a third aspect, computer program product is provided, comprising instructions which, when executed by a computer, cause the computer carry out the method of the second aspect.

According to a fourth aspect, a computer readable medium is provided, comprising instructions which, when executed by a computer, causes the computer to carry out the method of the second aspect.

Many of the attendant features will be more readily appreciated as they become better understood by reference to the following detailed description considered in connection with the accompanying drawings.

BRIEF DESCRIPTION OF THE DRAWINGS

The accompanying drawings, which are included to provide a further understanding of the example embodiments and constitute a part of this specification, illustrate example embodiments and together with the description help to explain the principles of the example embodiments. In the drawings.

Like references are used to designate like parts in the accompanying drawings.

DETAILED DESCRIPTION

Figure 1:
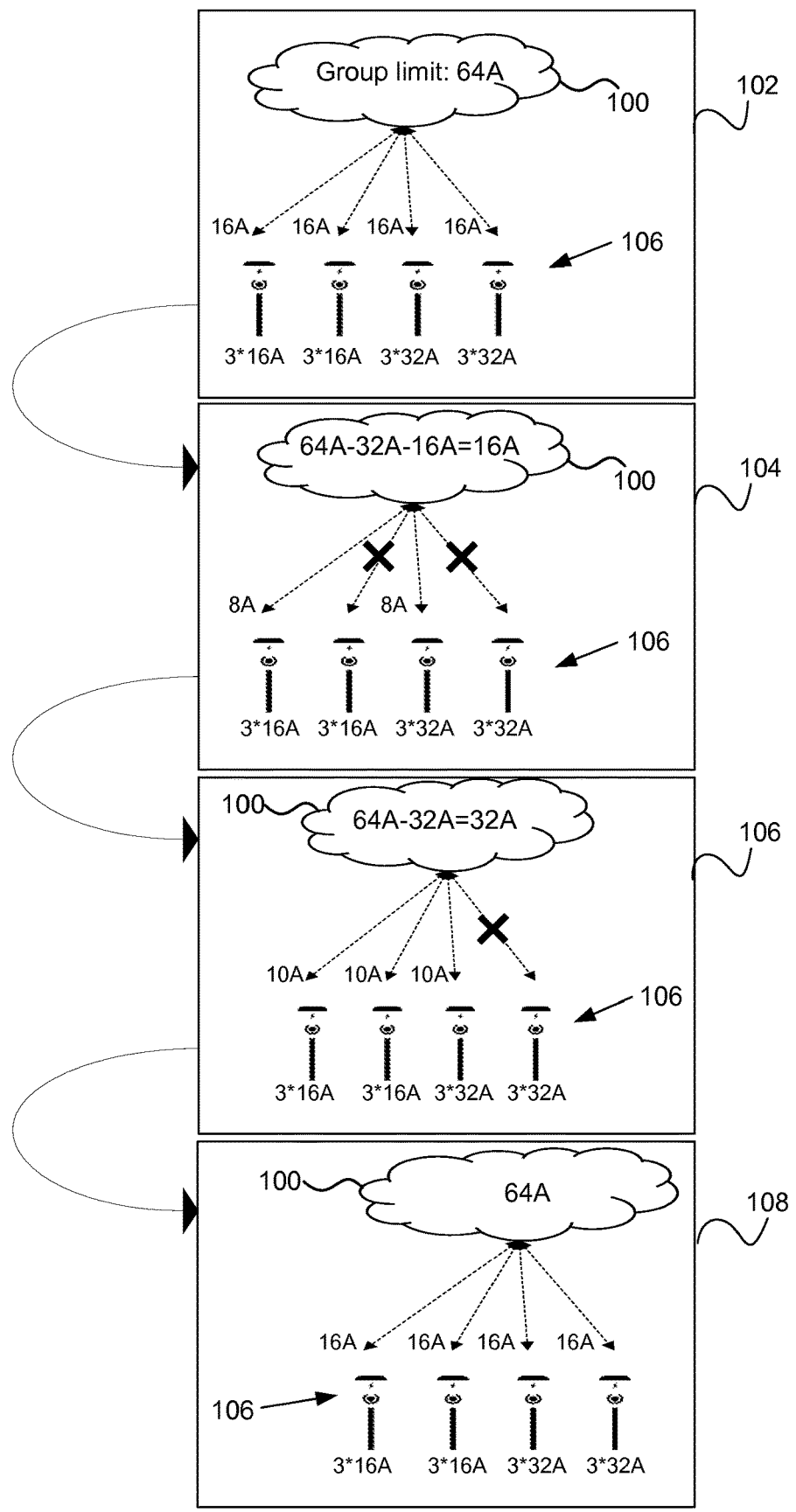
FIG. 1 illustrates an example of performing a countermeasure by an apparatus in case one or more charging stations in a dynamic load management group become offline, according to an example embodiment.

Reference will now be made in detail to example embodiments, examples of which are illustrated in the accompanying drawings. The detailed description provided below in connection with the appended drawings is intended as a description of the present examples and is not intended to represent the only forms in which the present examples may be constructed or utilized. The description sets forth the functions of the example and a possible sequence of operations for constructing and operating the example. However, the same or equivalent functions and sequences may be accomplished by different examples.

Dynamic load management (DLM) is a technology used in electric vehicle (EV) industry to manage energy in a group of charging stations. A single charging station may have one or more charging points. A charging point may comprise means for providing charging power to an EV, such as a charging cable. A DLM solution may be built in a way, where multiple charging points are grouped into a single group. The group may be assigned with a maximum current rating that the charging points are not allowed to exceed.

With centralized DLM solutions, a CSMS (charging station management system) continuously adjusts a maximum current rating the charging points can use for charging. The CSMS may control each charging point individually via an API (application programming interface). Every time a DLM event takes place, the CSMS may recalculate the maximum current rating for each charging point. However, eventually the EV dictates the amount of power it will use for charging. In other words, a maximum limit may be set to the charging point which the EV will respect but the EV can use also less power. The amount of power the EV uses depends on the charging cycle, i.e., starting the charge, in the middle of the charge, finishing the charge, and so on.

For example, if a site limit is 64A, and there are eight charging points charging simultaneously, the available charging current per charging point may be 64A/8=8A. When there are four charging stations charging, the available current per charging station may be 64A/4=16A. The DLM system may also support VIP-charging. The concept of VIP-charging means that some EV drivers may get a higher charging power than others. A VIP status is based on the user, not the charging point.

Demand load management may operate in the cloud. The cloud refers to servers that are accessed over the internet, and the software and databases that run on those servers. Hence, computing and storage may take place on the cloud servers remotely, instead of locally on a user device, for example.

A main vulnerability of a cloud-based load management is the internet connection—what happens when a charging station loses its connection to the CSMS? If a charging station is offline, the CSMS may have no visibility or control over it. For example, an electric vehicle (EV) driver may start charging on an offline charging station locally, e.g., by using an RFID tag. The offline charging station may start or continue charging according to the latest accepted request from the CSMS. In a worst-case scenario, it is possible that a charging station drops offline while the CSMS's latest request to the charging station was to charge with a maximum power. If someone then starts a charging transaction, the charging station would start charging with the maximum power without the CSMS even knowing about it due to the lost internet connection. This charging load is then considered as a non-controllable load, as the CSMS may not have any capability for managing the load. Potentially, this could lead to an over-current, where fuses start blowing. This is especially the case if charging stations drop offline on a larger scale.

According to one approach, the charging power of charging stations may be locally adjusted when they are offline. This means, that the charging stations are connected to one another via an Ethernet cable and in most cases, additional control unit is required to be installed on-site. Further, the local management is a master-slave type of implementation, where one unit, i.e., the master, controls the others, i.e., slaves. This setup usually forces "a vendor-lock", meaning that it may not be possible to mix and match charging stations from different manufacturers. Also, the local solution is more expensive when compared to cloud-based solutions, as it requires additional cabling and digging the cables into the ground.

An objective is to provide a cloud-based solution that reacts to situations where one or more charging points drop offline while subjected to load management services. In an embodiment, a bandwidth is reserved for the uncontrollable offline charging stations by reducing available capacity of the remaining online charging stations. In addition, a maximum available current of a charging point may be set to a minimum current once a user stops charging. This may reduce the risk of a charging point dropping offline with the latest request being too high, such as maximum power.

The proposed solution is not limited to specific hardware manufacturers or charging station models but instead, the solution is compatible for example with any OCPP-compliant charging station. Further, the offline capabilities are deployed via the cloud. This means, that no actions may be needed on the actual installation site. The charging station are not required to be physically connected to one another.

In case a charging station drops offline, i.e., a status of the charging station may have changed from online to offline, an apparatus may reduce available capacity of a DLM group. The apparatus may be configured to detect a charging station is offline based on skipped heartbeats, for example. The heartbeat is a periodic signal generated by hardware or software of the charging station to indicate normal operation to the apparatus. When the apparatus detects a skipped heartbeat, it may detect that the heartbeat, i.e., a certain message from the charging station, is not received within a configured period. The DLM group's available capacity may be reduced by a value that is equivalent to the latest request the apparatus has send to a charging point of the charging station before it went offline.

At first, a charging station may be online. The apparatus configured to perform DLM may adjust the maximum current of the charging station to 10A, for example.

Thereafter, the charging station goes offline. As the apparatus may not be able to control the charging point of the charging station anymore, the DLM group's available capacity may be reduced by 10A, which corresponds to the latest accepted request of the offline charging station. Hence, a new DLM group limit may be 100A−10A=90A.

Later, the charging station becomes online. Once the apparatus detects the charging station is online again, the DLM group's limit may be restored to 100A by the apparatus. The apparatus may be configured to detect the charging station is again online, for example, based on a received heartbeat or any other message from the charging station.

FIG. 1 illustrates another example of performing a countermeasure by an apparatus 100 in case one or more charging stations in a dynamic load management group 106 become offline, according to an example embodiment. The apparatus 100 may be communicatively coupled with a plurality of charging stations. The apparatus 100 and the plurality of charging stations may be wirelessly coupled, for example, via a cloud. The apparatus 100 may be configured to monitor and control one or more DLM groups. Each of the plurality of charging stations may belong to one or more DLM groups. Because the apparatus 100 and the plurality of charging stations may communicate wirelessly over the internet, the apparatus and the plurality of charging stations may be located at a long distance from each other, such as in different cities or even different countries.

At 102, each charging station of a DLM group 106 may be online. Hence, DLM may be performed by the apparatus 100 as usual. For example, a maximum current limit for the group may be 64 A. In case there are four charging stations in the DLM group 106, each charging station may receive 16 A maximum power.

At 104, two charging stations in the DLM group 106 may have gone offline. Hence, the apparatus 100 may be configured to decrease the maximum current limit (i.e., maximum current rating) of the DLM group 106 by the sum of maximum current ratings of the two charging stations. For example, the maximum current rating of a first offline charging station may be 16 A and the maximum current rating of a second offline charging station may be 32 A. A maximum current rating of a charging station may be also referred to as a maximum charging current. Hence, the new temporary limit for the DLM group 106 may be calculated by: 64A−32A−16A=16A. Consequently, the charging stations which remained online may each receive 8 A at maximum (16 A/2).

At 106, one of the offline charging stations may return to an online state. After at least one offline charging station has re-established connection to the apparatus 100, the DLM group's 106 maximum current limit may be recalculated by the apparatus 100. For example, if the first offline charging station having the maximum current rating of 16 A re-established the connection, the new temporarily limit may be calculated by: 64A—32A=32A. Hence, the maximum current limit may be divided with the three online charging stations such that each gets 10 A current at maximum.

At 108, the second offline charging station has also re-established the connection with the apparatus 100. Because each charging station of the DLM group 106 is now back online, the original maximum current limit 64 A may be restored by the apparatus 100. The apparatus 100 may send a current adjustment message for each of the charging stations accordingly.

The above method may be especially useful in case some of the charging points drop offline. However, in case all charging points drop offline, the apparatus may not have any control over the charging stations anymore while there are no online charging stations. Hence, adjusting the group's available capacity may not have a desired impact in all situations. A further improvement for the dynamic load management is presented next to take into account also the occasions where most or even all of the charging station may simultaneously become offline.

An example embodiment may enable reducing the risk of a charging station dropping offline with the latest request being for maximum power. This may be achieved by setting the maximum current rating of a charging station to a minimum current once a charging transaction at the charging station is stopped. The minimum current may be, for example, 6 A, or any other predetermined value. In practice, this may mean that all idle or inactive charging points are configured to output 6 A (or other predetermine value) at maximum.

Once a user starts a charging transaction, the apparatus may be configured to calculate a "real" available maximum current based on the DLM logic, i.e. a maximum current rating of a DLM group is assigned and evenly divided between charging points that are charging. If the inactive/idle charging station start losing connection and goes offline, the charging station that was inactive cannot output more than the set 6A in case an EV driver starts charging, for example, using an RFID tag.

Because it may not be desired to prevent charging entirely, a minimum current for an inactive charging station may be set to 6 A instead of simply setting it to 0 A. If the user were not able to charge at all, this would be bad from a user experience point of view. Associated electric systems may be designed in a way that they can handle all the charging points to charge simultaneously with a minimum current. However, in many cases sites may not be able to handle them all charging simultaneously with higher power. This is the reason why DLM is used in a first place.

Automatic setting of a minimum current for charging stations upon the end of a charging transaction may be particularly useful in case most or all charging stations tend to drop offline. For example, considering a group of 20 charging station with 32 A as their setting for maximum current rating after losing connection for DLM versus 20 charging stations with 6 A as their setting for maximum current rating. The difference is huge. By setting a low current value based on the states of the charging stations, safe functioning of the charging system may be ensured.

Figure 2:
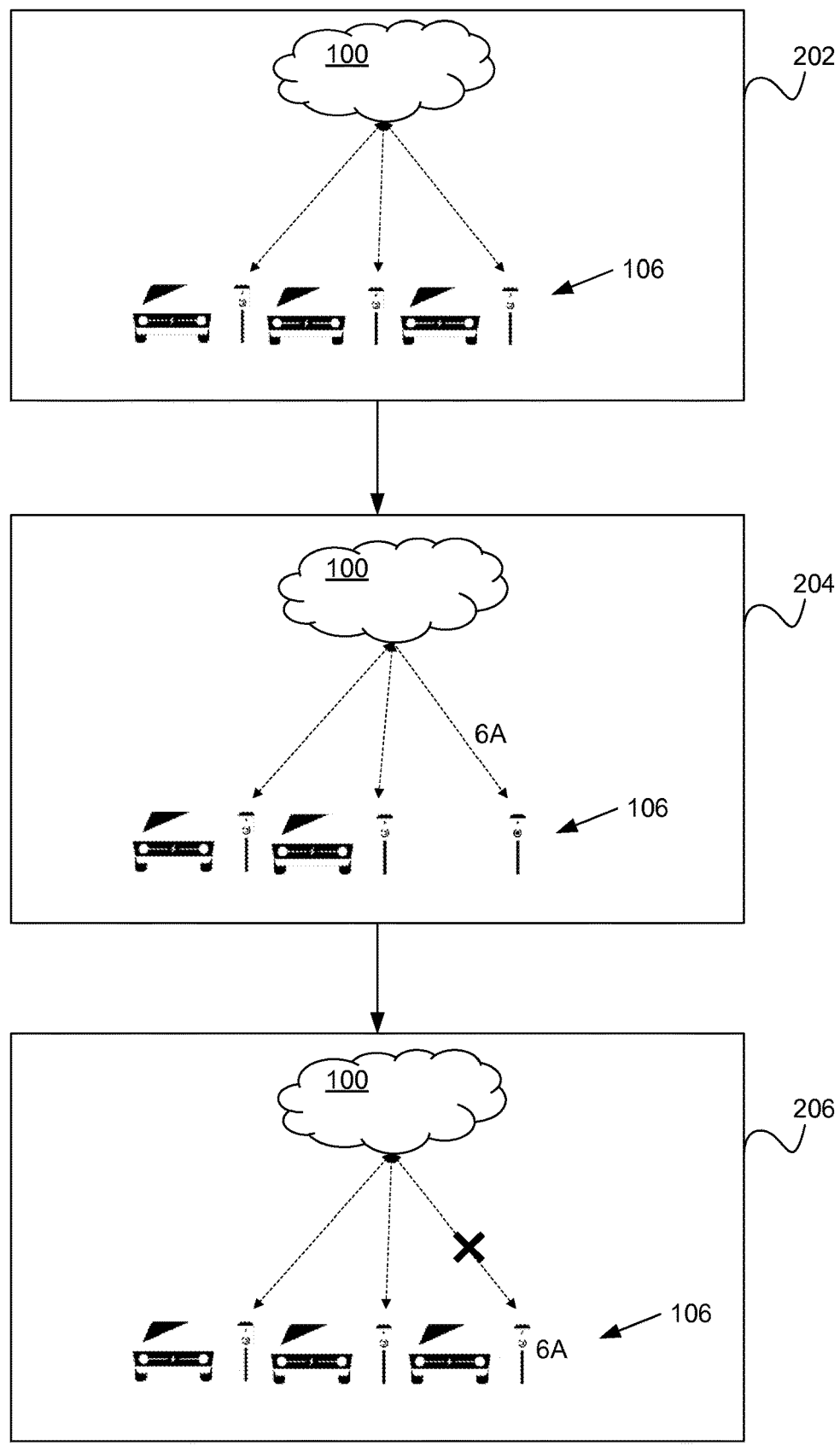
FIG. 2 illustrates an example of a countermeasure performed by an apparatus in case most of charging stations in a dynamic load management group go offline according to an example embodiment.

FIG. 2 illustrates an example of countermeasure performed by an apparatus 100 in case most of charging stations in a DLM group 106 go offline, according to an example embodiment. The DLM group 106 comprises a plurality of charging points.

At 202, all charging points in the DLM group 106 are online and charging an EV. Hence, the apparatus 100 may be configured to perform DLM as usual.

At 204, one EV leaves. Because the associated charging point is now longer charging, it may go to an idle mode. In response to detected idle mode, the apparatus 100 may be configured to set a maximum current rating value of the now idle charging point to a predetermined value, such as 6A.

A moment later, the idle charging point goes offline. At 206, a new EV arrives at the offline charging point, and someone starts charging for example using an RFID-card. Advantageously, as the latest accepted request at 204 was 6 A, the offline charging station cannot exceed the given current value. Therefore, the customer may be still served while ensuring proper functioning and safety of whole the charging system. In general, a charging system may refer to a charging station and associated infrastructure as well as EVs being charged. Because the maximum charging current of an offline charging station is determined based on the latest accepted message, not more than the predetermined current may be provided to the user even if the user has a VIP-status, and the user would be normally provided with a higher current based on the VIP-status.

The procedures described above may not be exclusive. An apparatus may be configured to perform both procedures according to FIG. 1 and FIG. 2. This may enable reducing risks caused by temporary offline situations of the charging stations. Having both procedures implemented may seem excessive and making the life of EV drivers difficult. However, in reality, if a charging station drops offline, it is only a momentary problem. Nevertheless, it is possible that for example a telecom operator has outages in their services. In this case, charging stations relying on a cloud-based DLM may be in trouble. And therefore, having a fail-safe mechanism that tries tackling the offline situations is needed. If we exclude telecom operator's issues and assume that the charging site is designed and built with care, charging stations really should not drop offline for example because of bad reception. From this perspective, having both methods should not be causing inconvenience to the EV drivers because offline occasions should take place rather rarely. Further, implementing both methods may be actually better from the user experience point of view, because fuses will be quite heavily guarded, meaning that the fuses are not likely to blow (which would prevent everyone from charging). Hence, the EV drivers would get at least some charge during an offline event.

Figure 3:
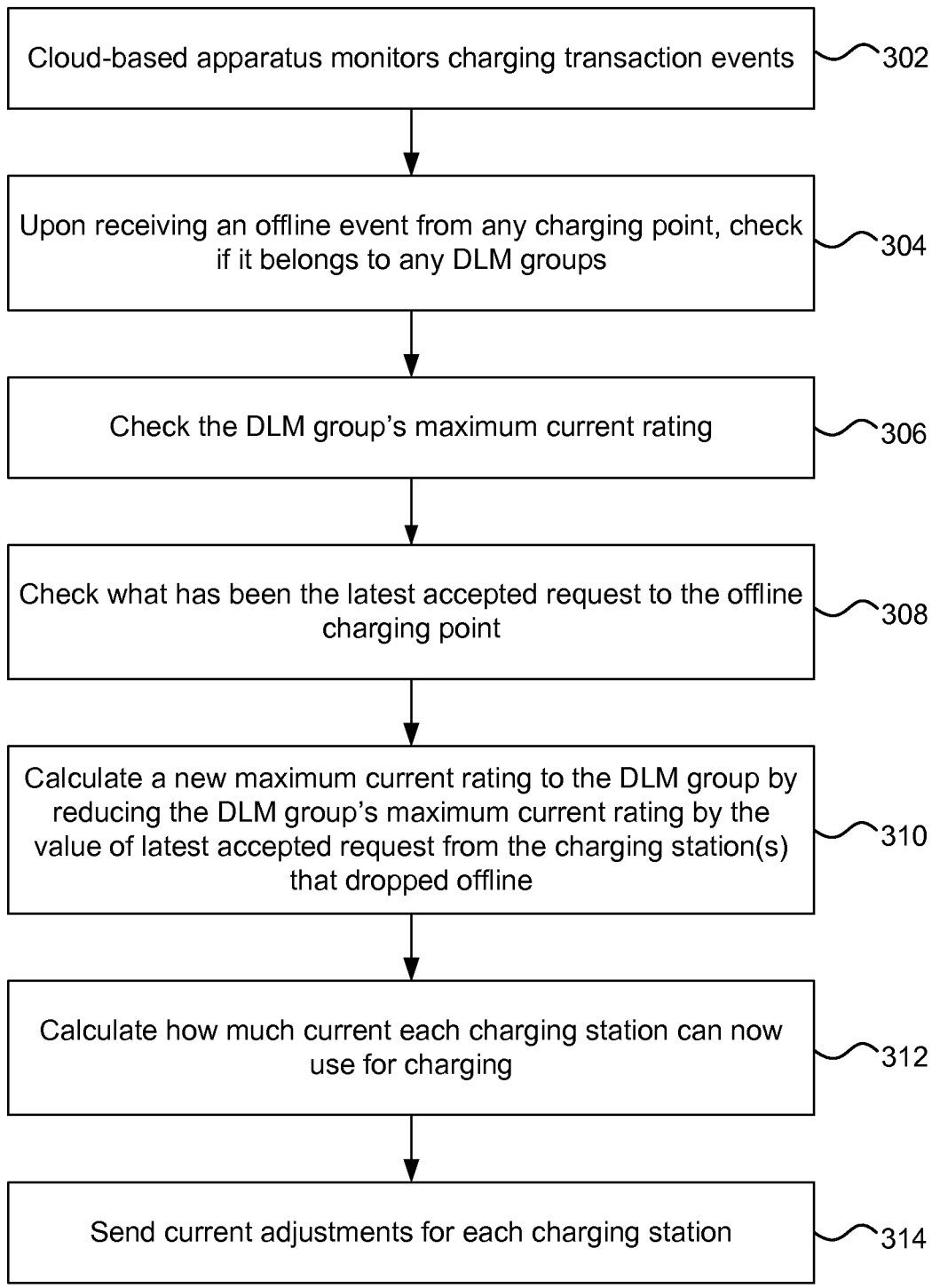
FIG. 3 illustrates an example of a method for improving dynamic load management during offline periods by reducing available capacity, according to an example embodiment.

FIG. 3 illustrates an example of a method for improving dynamic load management during offline periods by reducing available capacity, according to an example embodiment.

At an operation 302, charging transaction events may be monitored by an apparatus. The apparatus may be configured to monitor and control a plurality of charging stations remotely over the internet. Hence, the apparatus may be referred to as a cloud-based apparatus. The transaction event may refer to a change in a status of a charging point. The status may indicate, for example, whether the charging station is online or offline.

At an operation 304, the method may comprise checking, by the apparatus upon receiving an offline event from any charging point, if the charging point belongs to any DLM groups. The reception of an offline event may refer to a reception of a transaction event indicating the respective charging station is offline. The offline event may occur, for example, when a heartbeat message is not received from the charging station or when any other expected message is not being received by the apparatus from the charging station. At an operation 306, the method may comprise checking, by the apparatus, what is a current maximum current rating of the DLM group.

At an operation 308, the method may comprise checking, by the apparatus, what was the latest accepted request to the offline charging point.

At an operation 310, a new maximum current rating may be calculated for the associated DLM group by reducing the DLM group's current maximum current rating by the value of latest accepted request from the station (s) dropped charging that offline. The calculation may be performed by the apparatus.

At an operation 312, the method may comprise calculating, by the apparatus, how much current each charging station can now use for charging. The current value for charging may be calculated by dividing the maximum current rating of the DLM group determined at the operation 310 by the number of online charging stations.

At an operation 314, current of each online charging station may be adjusted. For example, the apparatus may be configured to send messages to the online charging stations to adjust their respective maximum current ratings according to the value determined at the operation 312.

Figure 4:
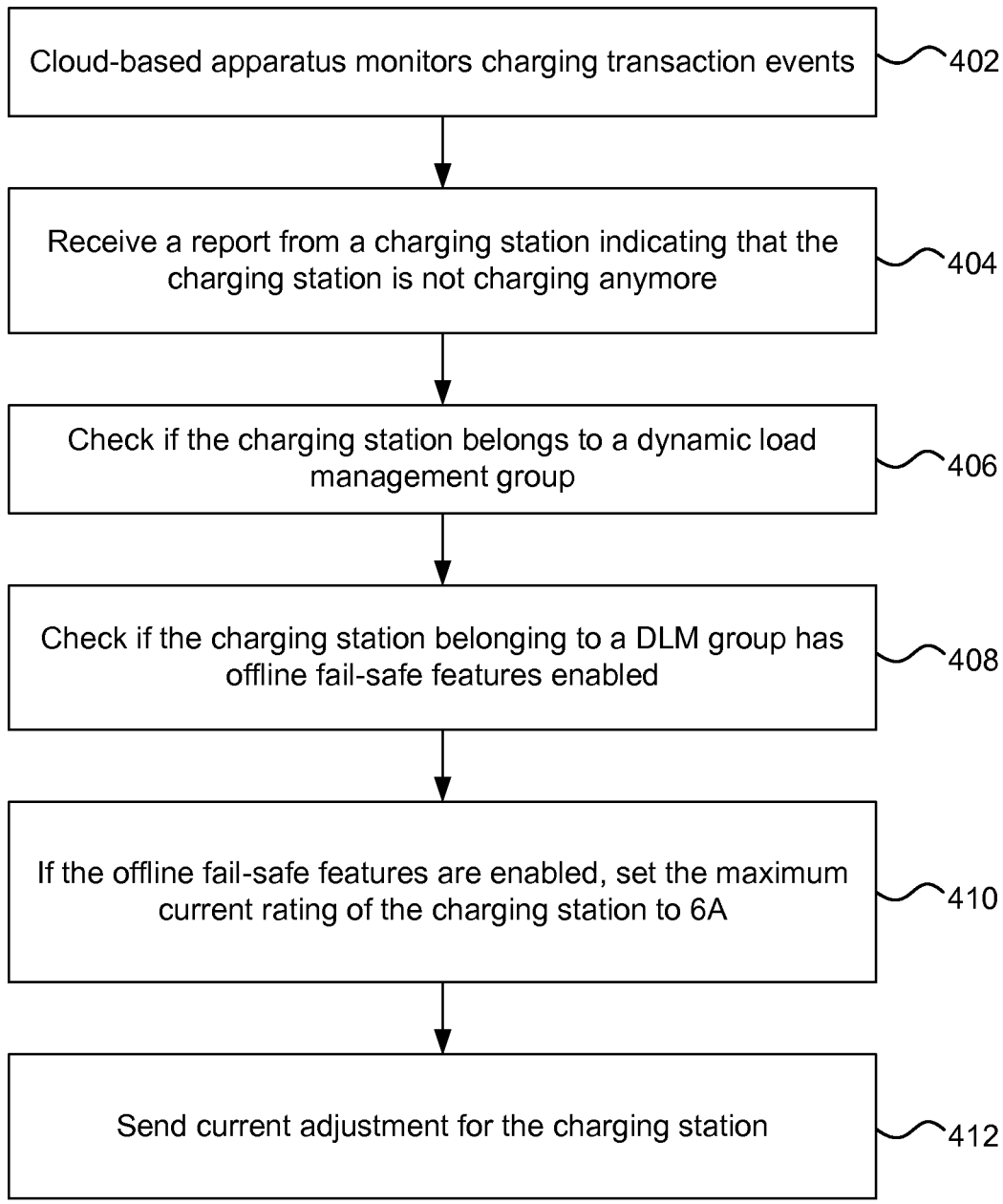
FIG. 4 illustrates an example of a method for improving dynamic load management during offline periods by controlling minimum currents based on charging transaction events, according to an example embodiment.

FIG. 4 illustrates an example of a method for improving dynamic load management during offline periods by controlling minimum currents based on charging transaction events, according to an example embodiment. At an operation 402, charging transaction events may be monitored by an apparatus. The apparatus may be configured to monitor and control a plurality of charging stations remotely over the internet. Hence, the apparatus may be referred to as a cloud-based apparatus. The transaction event may refer to a change in a status of a charging point. The status may indicate, for example, whether the charging station is online or offline. The transaction event may also indicate a charging state of a charging point, such as a start or a stop of a charging event. The charging state may indicate a status of a charging station. For example, the status of the charging station may be active when the charging station is charging and inactive when it is not charging.

At an operation 404, a report may be received by the apparatus from a charging point or a charging station indicating that the charging point is not charging anymore. The report may be triggered, for example, when an EV driver has stopped a charging transaction at the charging point.

At an operation 406, the method may comprise checking, by the apparatus, if the charging point belongs to a DLM group.

After determining the charging point belongs to a DLM group, at an operation 408, the method may comprise checking, by the apparatus, if the DLM group has offline fail-safe features enabled. When the offline fail-safe feature is enabled, the apparatus may be allowed to change a maximum current rating of a charging point upon determining there is no active charging transaction at the respective charging point, i.e., nobody is currently charging at the charging point.

After determining the offline fail-safe features are enabled, at an operation 410, a maximum current rating of the respective charging station may be set to 6 A by the apparatus. At an operation 412, the method may comprise sending current adjustment to the charging station. For example, the apparatus may be configured to send a message to the charging station with the stopped charging transaction to adjust the maximum current rating of the charging station according to the value determined at the operation 410.

Further features of the methods directly result from the functionalities and parameters of the apparatus as described in the appended claims and throughout the specification and are therefore not repeated here. It is noted that one or more operations of the method may be performed in different order.

Figure 5:
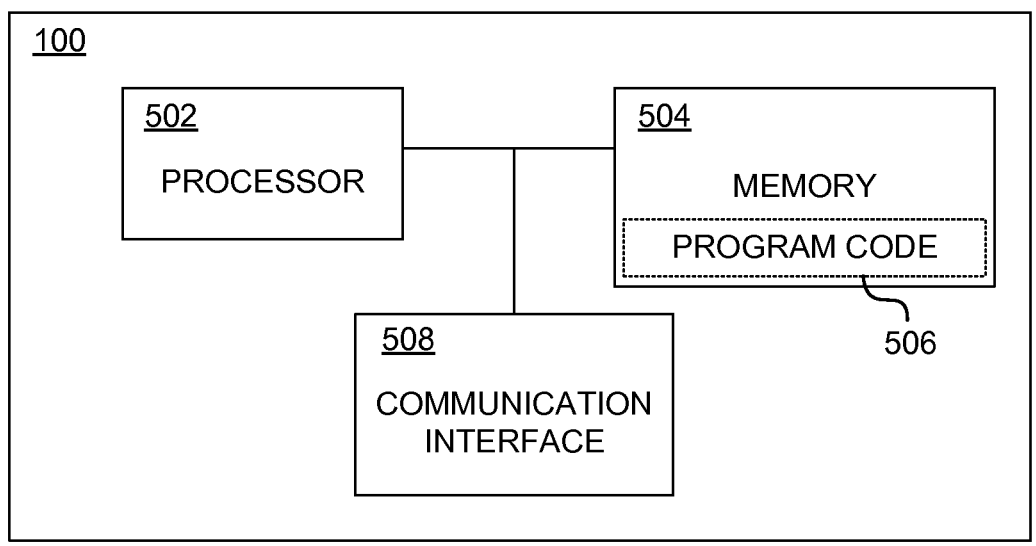
FIG. 5 illustrates an example of an apparatus configured to practice at least one example embodiment.

FIG. 5 illustrates an example of an apparatus 100 configured to practice at least one example embodiment.

The apparatus 100 may comprise at least one processor 502. The at least one processor 502 may comprise, for example, one or more of various processing devices, such as for example a co-processor, a microprocessor, a controller, a digital signal processor (DSP), a processing circuitry with or without an accompanying DSP, or various other processing devices including integrated circuits such as, for example, an application specific integrated circuit (ASIC), a field programmable gate array (FPGA), a microcontroller unit (MCU), a hardware accelerator, a special-purpose computer chip, or the like.

The apparatus 100 may further comprise at least one memory 504. The memory 504 may be configured to store, for example, computer program code 506 or the like, for example operating system software and application software. The memory 504 may comprise one or more volatile memory devices, one or more non-volatile memory devices, and/or a combination thereof. For example, the memory may be embodied as magnetic storage devices (such as hard disk drives, magnetic tapes, etc.), optical magnetic storage devices, or semiconductor memories (such mask ROM, PROM as (programmable ROM), EPROM (erasable PROM), flash ROM, RAM (random access memory), etc.).

The apparatus 100 may further comprise a communication interface 508 configured to enable the apparatus 100 to transmit and/or receive information, to/from other devices, such as charging stations. The communication interface 508 may be configured to provide at least one wireless radio connection, such as for example a 3GPP mobile broadband connection (e.g., 3G, 4G, 5G). However, the communication interface 508 may be configured to provide one or more other types of connections, for example a wireless local area network (WLAN) connection such as for example standardized by IEEE 802.11 series or Wi-Fi alliance; a short range wireless network connection such as for example a Bluetooth, NFC (near-field communication), or RFID connection; a wired connection such as for example a local area network (LAN) connection, a universal serial bus (USB) connection or an optical network connection, or the like; or a wired Internet connection. The communication interface 508 may comprise, or be configured to be coupled to, at least one antenna to transmit and/or receive radio frequency signals. One or more of the various types of connections may be also implemented as separate communication interfaces, which may be coupled or configured to be coupled to a plurality of antennas.

The apparatus 100 may comprise for example a server device, a client device, a mobile phone, a tablet computer, a laptop, or the like. In an embodiment, the apparatus 100 may comprise a CSMS. The apparatus may be cloud-based. Hence, the apparatus 100 may comprise applications, services or resources made available to users on demand via the Internet from a cloud computing server (s). Although the apparatus 100 is illustrated as a single device it is appreciated that, wherever applicable, functions of the apparatus 100 may be distributed to a plurality of devices.

When the apparatus 100 is configured to implement some functionality, some component and/or components of the apparatus 100, such as for example the at least one processor 502 and/or the memory 504, may be configured to implement this functionality. Furthermore, when the at least one processor 502 is configured to implement some functionality, this functionality may be implemented using program code 506 comprised, for example, in the memory 504.

The functionality described herein may be performed, at least in part, by one or more computer program product components such as software components. According to an embodiment, the apparatus 100 comprises a processor 502 or processor circuitry, such as for example a microcontroller, configured by the program code 506 when executed to execute the embodiments of the operations and functionality described. Alternatively, or in addition, the functionality described herein can be performed, at least in part, by one or more hardware logic components. For example, and without limitation, illustrative types of hardware logic components that can be used include Field-programmable Gate Arrays (FPGAs), application-specific Integrated Circuits (ASICs), application-specific Standard Products (ASSPs), System-on-a-chip systems (SOCs), Complex Programmable Logic Devices (CPLDs), Graphics Pro-cessing Units (GPUS).

The apparatus 100 comprises means for performing at least one method described herein. In one example, the means comprises the at least one processor 502, the at least one memory 504 including instructions which, when executed by the at least one processor 502, cause the apparatus 100 to perform the method.

It is obvious to a person skilled in the art that with the advancement of technology, the basic idea of the invention may be implemented in various ways. The invention and its embodiments are thus not limited to the examples described above, instead they may vary within the scope of the claims.

An apparatus may be configured to perform or cause performance of any aspect of the method (s) described herein. Further, computer program may comprise instructions for causing, when executed, an apparatus to perform any aspect of the method (s) described herein. Further, an apparatus may comprise means for performing any aspect of the method (s) described herein. According to an example embodiment, the means comprises at least one processor, and memory including program code, the at one memory and the program code configured to, when executed by the at least one processor, cause performance of any aspect of the method (s).

Any range or device value given herein may be extended or altered without losing the effect sought. Also, any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The operations of the methods described herein may be carried out in any suitable order, or simultaneously where appropriate. Additionally, individual blocks may be deleted from any of the methods without departing from the scope of the subject matter described herein. Aspects of any of the embodiments described above may be combined with aspects of any of the other embodiments described to form further embodiments without losing the effect sought.

The term 'comprising' is used herein to mean including the method, blocks, or elements identified, but that such blocks or elements do not comprise an exclusive list and a method or apparatus may contain additional blocks or elements.

As used in this application, the term 'circuitry' may refer to one or more or all of the following: (a) hardware-only circuit implementations (such as implementations in only analog and/or digital circuitry) and (b) combinations of hardware circuits and software, such as (as applicable): (i) a combination of analog and/or digital hardware circuit (s) with software/firmware and (ii) any portions of hardware processor (s) with software (including digital signal processor (s)), software, and memory (ies) that work together to cause an apparatus, such as a mobile phone or server, to perform various functions) and (c) hardware circuit (s) and or processor (s), such as a microprocessor (s) or a portion of a microprocessor (s), that requires software (e.g., firmware) for operation, but the software may not be present when it is not needed for operation. This definition of circuitry applies to all uses of this term in this application, including in any claims.

As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from scope of this specification.

The invention claimed is:

1. An apparatus for dynamic load management, the apparatus comprising:
   a communication interface for wireless communication with a plurality of charging stations;
   at least one processor; and
   at least one memory comprising instructions which, when executed by the at least one processor, cause the apparatus to:
   monitor for events indicative of status changes of the plurality of charging stations via the communication interface;
   determine based on the events that at least one charging station has changed status from online to offline;
   determine if the at least one charging station belongs to a dynamic load management group;
   determine a current maximum current rating of the dynamic load management group;
   determine a latest request for a maximum charging current of the charging station accepted by the at least one charging station, wherein the latest request for a maximum charging current is sent by the apparatus to the at least one charging station and accepted by the at least one charging station before the status of the respective charging station changed from online to offline;
   determine a new maximum current rating for the dynamic load management group by reducing the current maximum current rating of the dynamic load management group by a maximum charging current of the latest accepted request;
   determine new maximum charging currents for each charging station in the dynamic load management group which remained online based on the determined new maximum current rating for the dynamic load management group divided by the number of online charging stations in the dynamic load management group; and
   send a message comprising the new maximum charging current to each of the online charging stations for current adjustment via the communication interface.

2. The apparatus of claim 1, wherein the at least one memory comprises instructions which, when executed by the at least one processor, cause the apparatus to:
- determine based on the events that a charging station is inactive;
- determine if the inactive charging station belongs to the dynamic load management group;
- set the maximum charging current of the inactive charging station belonging to the dynamic load management group to a predetermined value; and
- send a message comprising the predetermined value as the maximum charging current to the inactive charging station via the communication interface.

3. The apparatus of claim 2, wherein the predetermined value is 6 A.

4. The apparatus of claim 2, wherein the at least one memory further comprises instructions which, when executed by the at least one processor, cause the apparatus to check if setting the maximum charging current of an inactive charging station to the predetermined value is allowed for the respective dynamic load management group; and wherein the maximum charging current of inactive charging stations is changed to the predetermined value when it is allowed for the respective dynamic load management group.

5. The apparatus of claim 1, wherein the events comprise at least one of a transaction event, a status notification or a skipped heartbeat message.

6. The apparatus of claim 1, wherein the at least one memory further comprises instructions which, when executed by the at least one processor, cause the apparatus to:
- detect, based on the events, that at least one charging station has changed status from offline to online;
- recalculate the maximum current rating for the respective dynamic load management group by increasing the present maximum current rating with a value of the latest accepted request for maximum charging current of the charging station that is online again; and
- send a message comprising the new maximum charging current to each of the online charging stations for current adjustment via the communication interface.

7. A computer-implemented method for dynamic load management, comprising:
- monitoring for events indicative of status changes of a plurality of charging stations via a communication interface configured for wireless communication;
- determining based on the events that at least one charging station has changed status from online to offline;
- determining if the at least one charging station belongs to a dynamic load management group;
- determining a current maximum current rating of the dynamic load management group;
- determining a latest request for a maximum charging current of the charging station accepted by the at least one charging station, wherein the latest request for a maximum charging current is sent by the apparatus to the at least one charging station and accepted by the at least one charging station before the status of the respective charging station changed from online to offline;
- determining a new maximum current rating for the dynamic load management group by reducing the current maximum current rating of the dynamic load management group by a maximum charging current of the latest accepted request;
- determining new maximum charging currents for each charging station in the dynamic load management group which remained online based on the determined new maximum current rating for the dynamic load management group divided by the number of online charging stations in the dynamic load management group; and
- sending a message comprising the new maximum charging current to each of the online charging stations for current adjustment via the communication interface.

8. The method of claim 7, further comprising:
- determining based on the events that a charging station is inactive;
- determining if the inactive charging station belongs to the dynamic load management group;
- setting the maximum charging current of the inactive charging station belonging to the dynamic load management group to a predetermined value; and
- sending a message comprising the predetermined value as the maximum charging current to the inactive charging station via the communication interface.

9. The method of claim 8, wherein the predetermined value is 6 A.

10. The method of claim 8, comprising:
- checking if setting the maximum charging current of an inactive charging station to the predetermined value is allowed for the respective dynamic load management group; and
changing the maximum charging current of inactive charging stations to the predetermined value when it is allowed for the respective dynamic load management group.

11. The method of claim 7, wherein the events comprise at least one of a transaction event, a status notification or a skipped heartbeat.

12. The method of claim 7, further comprising:
- detecting, based on the events, that at least one charging station has changed status from offline to online;
- recalculating the maximum current rating for the respective dynamic load management group by increasing the present maximum current rating with a value of the latest accepted request for a maximum charging current of the charging station that is online again; and
- sending a message comprising the new maximum charging current to each of the online charging stations for current adjustment via the communication interface.

* * * * *